US008618621B2

(12) United States Patent
Oppermann et al.

(10) Patent No.: US 8,618,621 B2
(45) Date of Patent: Dec. 31, 2013

(54) SEMICONDUCTOR DEVICE LAYER STRUCTURE AND METHOD OF FABRICATION

(75) Inventors: Klaus-Guenter Oppermann, Holzkirchen (DE); Martin Franosch, Munich (DE); Martin Handtmann, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/938,568

(22) Filed: Nov. 3, 2010

(65) Prior Publication Data
US 2011/0042764 A1   Feb. 24, 2011

Related U.S. Application Data

(62) Division of application No. 11/724,603, filed on Mar. 15, 2007, now Pat. No. 7,851,333.

(51) Int. Cl.
*H01L 29/84* (2006.01)

(52) U.S. Cl.
USPC ..... 257/416; 438/106; 438/464; 257/E29.324

(58) Field of Classification Search
USPC ................... 438/106, 464; 257/416, E29.324
See application file for complete search history.

(56) References Cited

U.S. PATENT DOCUMENTS

| | | | |
|---|---|---|---|
| 5,006,917 A | | 4/1991 | Kang |
| 5,047,363 A * | | 9/1991 | Hickernell et al. ............. 438/50 |
| 5,455,202 A | | 10/1995 | Malloy |
| 5,853,601 A * | | 12/1998 | Krishaswamy et al. .......... 216/2 |
| 5,877,034 A * | | 3/1999 | Ramm et al. ..................... 438/15 |
| 6,355,498 B1 * | | 3/2002 | Chan et al. ........................ 438/48 |
| 6,451,668 B1 * | | 9/2002 | Neumeier et al. ............ 438/401 |
| 6,492,195 B2 * | | 12/2002 | Nakanishi et al. ............ 438/106 |
| 6,506,620 B1 * | | 1/2003 | Scharf et al. .................. 438/52 |
| 6,509,813 B2 * | | 1/2003 | Ella et al. ....................... 333/187 |
| 6,521,511 B1 * | | 2/2003 | Inoue et al. ................... 438/458 |
| 6,589,855 B2 | | 7/2003 | Miyamoto |
| 6,696,320 B2 * | | 2/2004 | Gacusan ....................... 438/109 |

(Continued)

FOREIGN PATENT DOCUMENTS

DE   10316776 A1   11/2004
JP   2002 270 720   9/2002

OTHER PUBLICATIONS

Image File Wrapper for U.S. Appl. No. 11/724,603, filed Mar. 15, 2007, Inventor: Opperman et al.

*Primary Examiner* — Kimberly Rizkallah
*Assistant Examiner* — Caleb Henry
(74) *Attorney, Agent, or Firm* — Patterson Thuente Pedersen, P.A.

(57) ABSTRACT

An apparatus comprises a device layer structure, a device integrated into the device layer structure, an insulating carrier substrate and an insulating layer being continuously positioned between the device layer structure and the insulating carrier substrate, the insulating layer having a thickness which is less than $\frac{1}{10}$ of a thickness of the insulating carrier substrate. An apparatus further comprises a device integrated into a device layer structure disposed on an insulating layer, a housing layer disposed on the device layer structure and housing the device, a contact providing an electrical connection between the device and a surface of the housing layer opposed to the device layer structure and a molding material surrounding the housing layer and the insulating layer, the molding material directly abutting on a surface of the insulating layer being opposed to the device layer structure.

10 Claims, 19 Drawing Sheets

(56) References Cited

U.S. PATENT DOCUMENTS

| | | | |
|---|---|---|---|
| 6,730,948 B2 | 5/2004 | Umeda | |
| 6,744,335 B2 * | 6/2004 | Ryhanen et al. | 333/185 |
| 6,759,273 B2 | 7/2004 | Felton | |
| 6,774,746 B2 * | 8/2004 | Whatmore et al. | 333/189 |
| 6,870,445 B2 * | 3/2005 | Kawakubo et al. | 333/187 |
| 6,905,970 B2 * | 6/2005 | Shing et al. | 438/706 |
| 6,908,784 B1 * | 6/2005 | Farnworth et al. | 438/106 |
| 6,924,583 B2 * | 8/2005 | Lin et al. | 310/324 |
| 6,930,437 B2 * | 8/2005 | Nakatani et al. | 310/324 |
| 6,936,524 B2 * | 8/2005 | Zhu et al. | 438/459 |
| 6,936,837 B2 * | 8/2005 | Yamada et al. | 257/2 |
| 6,939,734 B2 * | 9/2005 | Franosch et al. | 438/53 |
| 6,940,712 B2 | 9/2005 | Chu | |
| 6,982,010 B2 | 1/2006 | Liu | |
| 7,002,245 B2 * | 2/2006 | Huang et al. | 257/701 |
| 7,019,604 B2 * | 3/2006 | Gotoh et al. | 333/187 |
| 7,037,844 B2 * | 5/2006 | D che et al. | 438/706 |
| 7,084,498 B2 | 8/2006 | Yamaguchi | |
| 7,098,575 B2 * | 8/2006 | Mehta | 310/324 |
| 7,173,332 B2 | 2/2007 | Silverbrook | |
| 7,208,333 B2 * | 4/2007 | Flanders et al. | 438/29 |
| 7,250,831 B2 * | 7/2007 | Song et al. | 333/133 |
| 7,312,505 B2 | 12/2007 | Kipnis | |
| 7,342,351 B2 * | 3/2008 | Kubo et al. | 310/344 |
| 7,445,963 B2 * | 11/2008 | Ho et al. | 438/113 |
| 7,456,709 B2 * | 11/2008 | Jung et al. | 333/187 |
| 7,459,343 B2 * | 12/2008 | Yamano | 438/114 |
| 7,492,241 B2 * | 2/2009 | Piazza et al. | 333/189 |
| 7,622,846 B2 * | 11/2009 | Song et al. | 310/324 |
| 7,635,636 B2 * | 12/2009 | McClure et al. | 438/455 |
| 7,648,855 B2 * | 1/2010 | Gillot et al. | 438/106 |
| 7,658,858 B2 * | 2/2010 | Hong et al. | 216/17 |
| 7,767,484 B2 * | 8/2010 | Ayazi | 438/52 |
| 8,004,021 B2 * | 8/2011 | Miller et al. | 257/226 |
| 8,043,880 B2 * | 10/2011 | Haluzak et al. | 438/50 |
| 2002/0048839 A1 * | 4/2002 | Miller et al. | 438/50 |
| 2002/0048907 A1 * | 4/2002 | Miyamoto et al. | 438/464 |
| 2002/0121337 A1 * | 9/2002 | Whatmore et al. | 156/285 |
| 2002/0126726 A1 * | 9/2002 | Flanders et al. | 372/107 |
| 2004/0063249 A1 * | 4/2004 | Lin et al. | 438/110 |
| 2004/0135144 A1 * | 7/2004 | Yamada et al. | 257/59 |
| 2004/0188786 A1 * | 9/2004 | Bar-Sadeh et al. | 257/419 |
| 2004/0241958 A1 | 12/2004 | Guarini | |
| 2005/0134401 A1 * | 6/2005 | Song et al. | 333/133 |
| 2005/0140468 A1 * | 6/2005 | Wang | 333/191 |
| 2005/0167799 A1 * | 8/2005 | Doan | 257/678 |
| 2005/0218755 A1 * | 10/2005 | Song et al. | 310/348 |
| 2006/0014320 A1 * | 1/2006 | Yamano et al. | 438/113 |
| 2006/0043507 A1 * | 3/2006 | Lobl et al. | 257/416 |
| 2006/0128063 A1 | 6/2006 | Yamano | |
| 2006/0176126 A1 * | 8/2006 | Wang et al. | 333/187 |
| 2006/0180898 A1 * | 8/2006 | Funaki et al. | 257/619 |
| 2006/0289901 A1 | 12/2006 | Sheppard | |
| 2007/0241076 A1 * | 10/2007 | Moffat et al. | 216/2 |
| 2008/0024042 A1 | 1/2008 | Isobe | |
| 2008/0079515 A1 * | 4/2008 | Ayazi et al. | 333/187 |
| 2009/0052008 A1 * | 2/2009 | Mcnie et al. | 359/290 |
| 2009/0108382 A1 * | 4/2009 | Eriksen et al. | 257/419 |
| 2010/0065934 A1 * | 3/2010 | Eriksen et al. | 257/419 |

* cited by examiner

SEMICONDUCTOR DEVICE LAYER STRUCTURE AND METHOD OF FABRICATION

RELATED APPLICATION

This application is a division of application Ser. No. 11/724,603 filed Mar. 15, 2007, which is hereby fully incorporated herein by reference.

BACKGROUND OF THE INVENTION

The present invention relates to an apparatus comprising a device and to a method for producing the apparatus comprising the device.

Electrical devices, for example semiconductor devices, are implemented on a semiconductor material or semiconductor substrate, for example silicon. Examples of devices of this kind are so-called BAW (Bulk Acoustic Wave) filters which are frequently operated as passive electrical RF (Radio Frequency) devices in the gigahertz range in electrical circuits. Thus, capacitive coupling either directly between individual conductive tracks or via an electrically conductive substrate material is frequently undesirable and to be avoided.

On the one hand, coupling among conductive tracks may be minimized by a skillful or suitable design of the pads and conductive tracks and a high-resistance semiconductor material may be used as a substrate or substrate material on which the electrical device is implemented so that capacitive coupling between the metal layers and/or conductive tracks via the substrate material can be prevented from occurring due to the high resistance. However using a lightly doped semiconductor material a voltage-dependent capacitance and/or substrate capacitance occurs between the metallic patterns in the device, such as, for example, the BAW filter, and the substrate. This voltage-dependent capacitance results from a surface field effect at a metal-insulator-semiconductor interface. This effect is known from MOS-transistors (Metal-Oxide-Semiconductor-transistors). Such a voltage-dependent substrate capacitance influences and/or disturbs the electrical performance when operating the device. Thus, voltage-dependent substrate capacitances should be kept low.

BRIEF DESCRIPTION OF THE DRAWINGS

Embodiments of the present invention will be detailed subsequently referring to the appended drawings, in which.

DETAILED DESCRIPTION OF THE DRAWINGS

Figure 1:
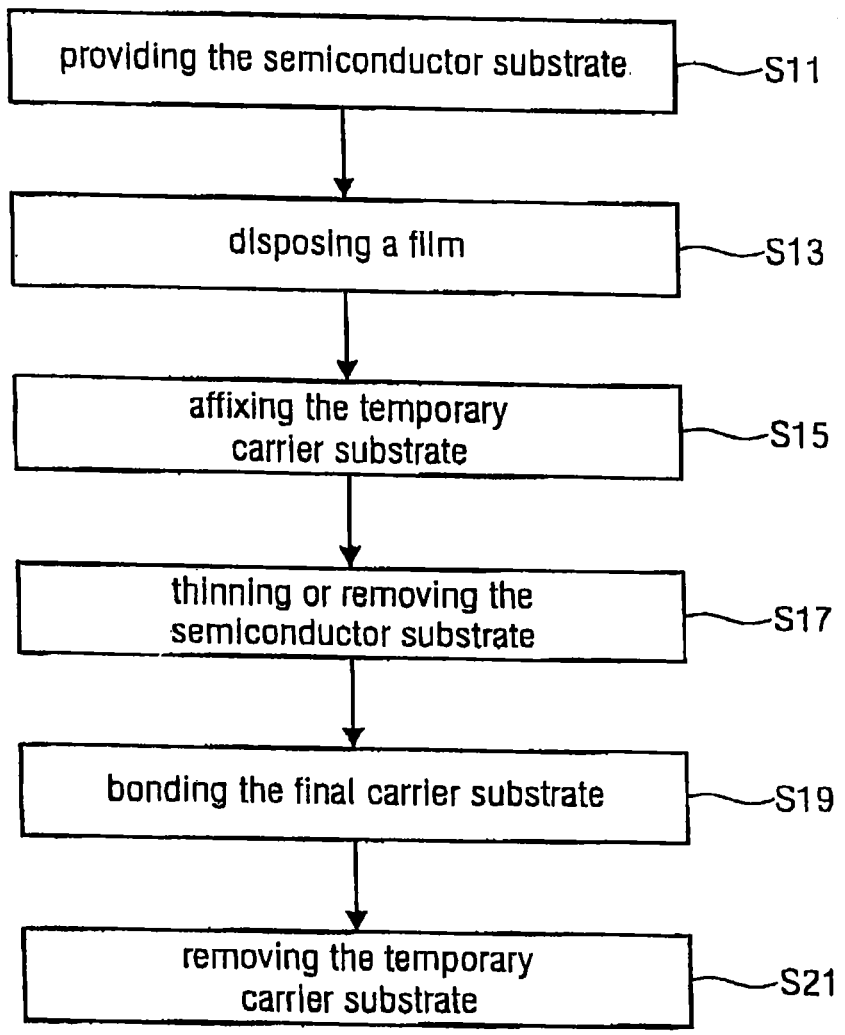
FIG. 1 shows a method for producing an apparatus comprising a device according to an embodiment of the present invention.
Figure 2A:
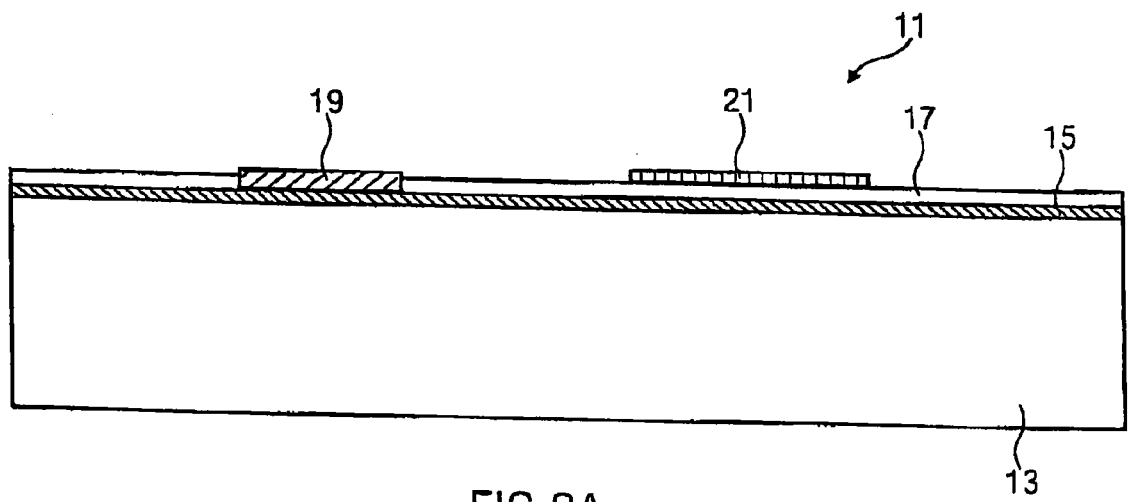
FIGS. 2a-f are schematic views of the apparatus during production by means of a production method according to an embodiment of the present invention.

FIG. 1 discusses a flow of a method for producing an apparatus comprising a device according to an embodiment of the present invention. In step S11, a semiconductor substrate comprising a device is provided. FIG. 2a shows such a device assembly 11 having a starting semiconductor substrate 13 on which an insulating layer 15, for example made of an oxide material or a nitride material, is applied. Nitrides or oxides of this kind may, for example, be a silicon oxide or a silicon nitride. Thus, the insulating layer 15 can be applied such that it completely covers a surface of the starting semiconductor substrate 13.

A device layer structure 17 and an electrical device 19 are disposed on the insulating layer 15 on a surface opposed to the starting semiconductor substrate 13. The electrical device 19 is integrated in a recess of the device layer structure 17 and, thus, implemented in the device layer structure 17. The electrical device 19 may, for example, extend to the insulating layer 15. The device layer structure 17 can be applied on an insulating layer 15 surface opposed to the starting semiconductor substrate 13 such that it completely covers the insulating layer 15. An electrical contact 21 is applied on a device layer structure 17 surface opposed to the insulating layer 15.

A capacitance or substrate capacitance evolves between the starting semiconductor substrate 13 and a metal layer, not shown here, in the electrical device 19 which may, for example, be a BAW filter. The value of the substrate capacitance depends on a voltage between the electrical device 19 and the starting semiconductor substrate 13. Furthermore, a voltage-dependent substrate capacitance evolves between the electrical contact 21 and the starting semiconductor substrate 13. In an electrical equivalent circuit first substrate capacitance is formed between the electrical device 19 and the starting semiconductor substrate 13, while a second electrical substrate capacitance is formed between the electrical contact 21 and the starting semiconductor substrate 13. Hence the semiconductor substrate 13 represents a coupling resistor producing an electrical connection between a terminal at the first substrate capacitance and a terminal at the second substrate capacitance both terminals being positioned in the semiconductor substrate 13 at different locations.

The result is a capacitive coupling between a metal layer in the electrical device 19 and the metal layer of the contact 21 via the starting semiconductor substrate 13 and the two substrate capacitances. The insulating layer 15 contributes decisively to the two substrate capacitance evolving.

The device assembly 11 shown in FIG. 2a can be produced easily in a semiconductor factory by means of a conventional standard processing method, wherein all layers and structures for producing the RF device 19 and/or the BAW filter 19 are produced on a silicon wafer.

Figure 2B:
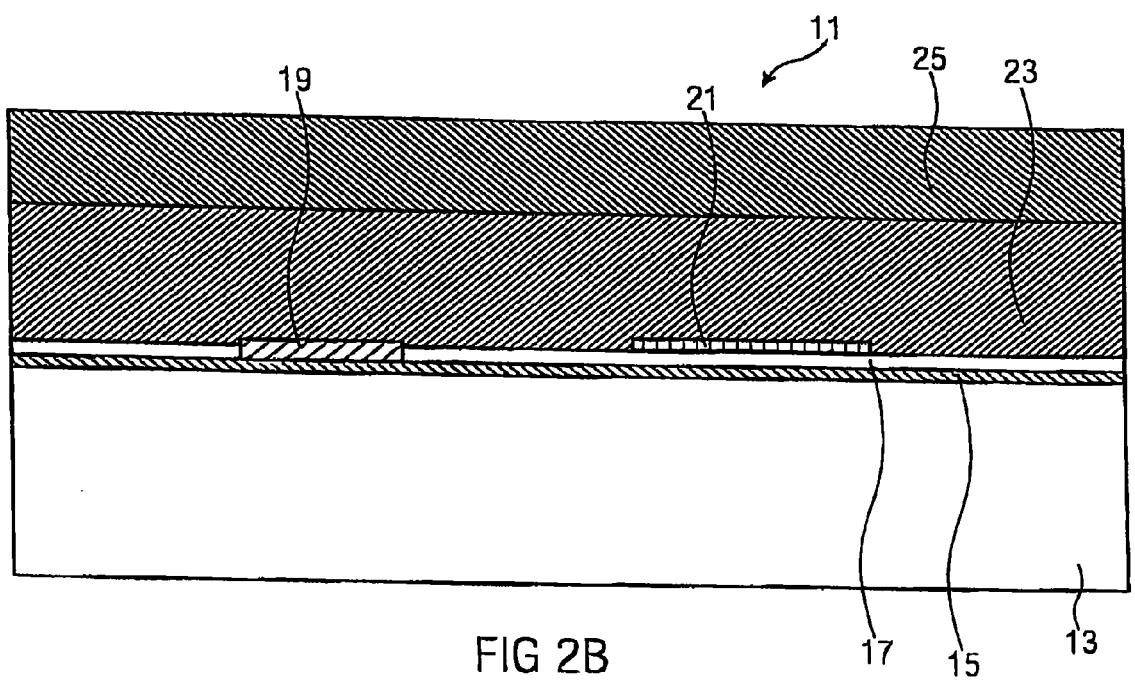

In step S13, a film 23, for example a thermo-release film, is disposed, laminated or applied on a device layer structure 17 surface facing the electrical contact 21. Subsequently, in step S15, a temporary carrier substrate 25 is affixed to the starting semiconductor substrate 13 such that the device layer structure 17 is disposed on a starting semiconductor substrate 13 side facing the temporary carrier substrate 25 and/or the device layer structure 17 is disposed between the temporary carrier substrate 25 and the starting semiconductor substrate 13. A set-up of the device assembly 11 produced in this way is shown in FIG. 2b.

Figure 2C:
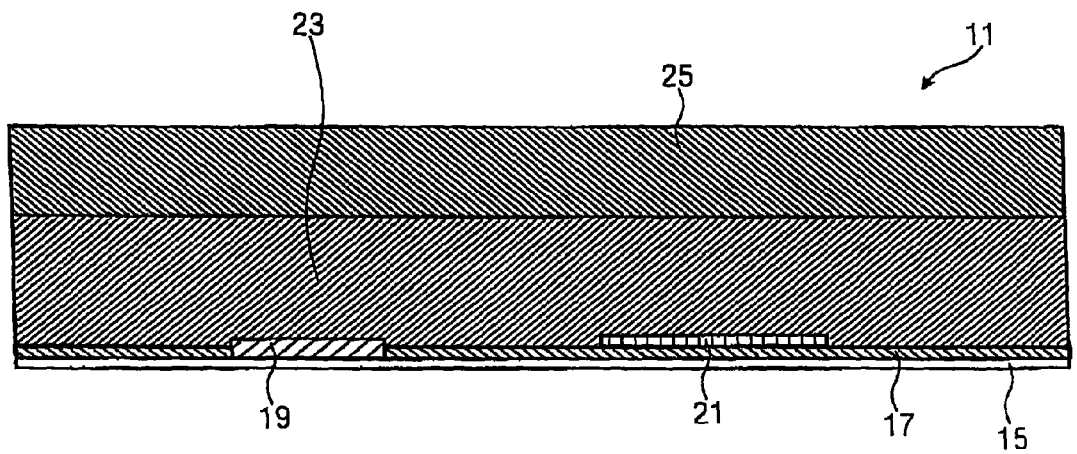

In step S17, the starting semiconductor substrate 13 is thinned and/or removed starting from a starting semiconductor substrate 13 side opposed to the insulating layer 15. The thinning and/or removing of the starting semiconductor substrate 13 can be performed by means of grinding the starting semiconductor substrate 13 or etching the starting semiconductor substrate 13. The etching here can be performed such that the starting semiconductor substrate 13 is removed completely, wherein the insulating layer 15 may e.g. serve as an etch stop which stops an etch process spreading from the bottom of the starting semiconductor substrate 13. A possible layer sequence in the multi-layered set-up shown in FIG. 2b would be a starting semiconductor substrate 13 made of silicon and an insulating oxide 15 made of an oxide or a silicon nitride, wherein such a layer sequence would allow etching the silicon substrate 13 to the insulating layer 15. A set-up of the device assembly 11 after removing the starting semiconductor substrate 13 is shown in FIG. 2c.

Figure 2D:
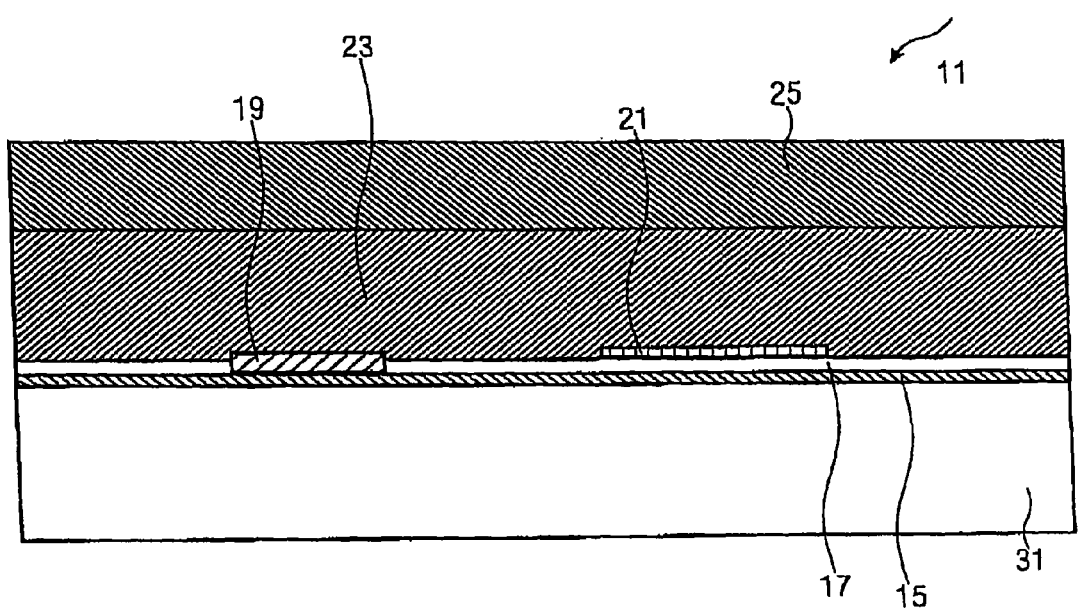

In step S19, a final carrier substrate and/or a new suitable substrate is glued or bonded to an insulating layer 15 surface opposed to the device layer structure 17, wherein the final carrier substrate 31 may comprise improved electrical characteristics. The final carrier substrate here is made of an insulating material, for example, glass or ceramic. A set-up of the device assembly 11, including the insulating carrier substrate 31 and/or the final carrier substrate 31 produced in this way is shown in FIG. 2d.

Figure 2E:
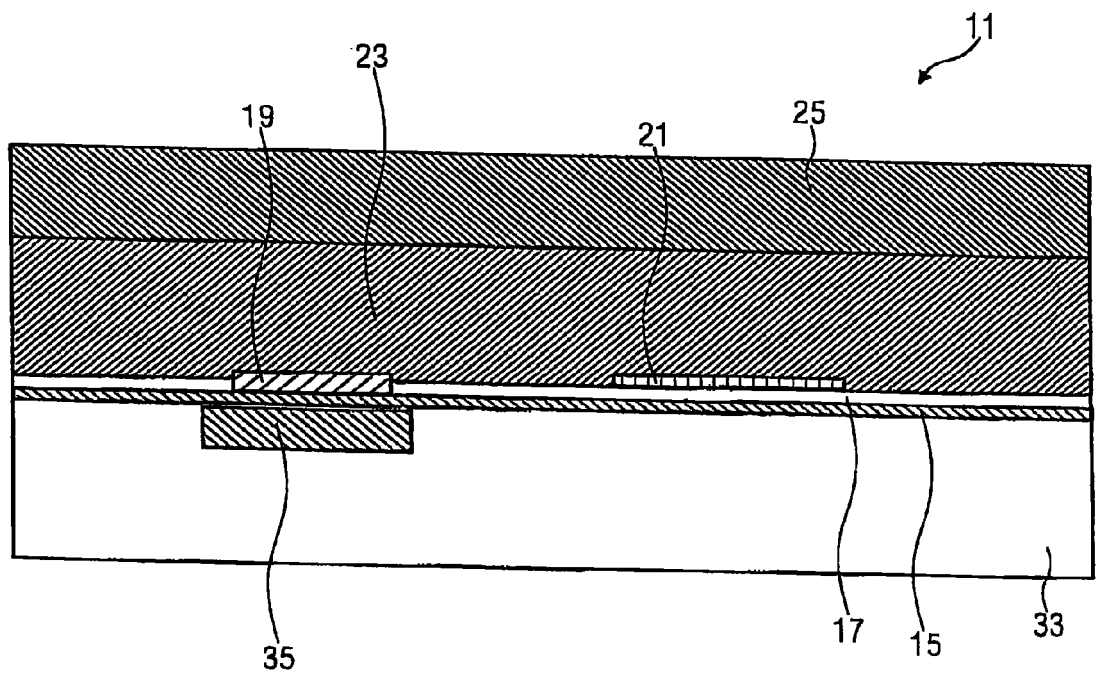

Step S19 may also be performed such that a patterned final carrier substrate 33 is glued and/or bonded to an insulating layer 15 surface opposed to the device layer structure 17 instead of the insulating carrier substrate 31 so that, as is shown in FIG. 2e, a cavity 35 is formed between a patterned carrier substrate 33 surface facing the insulating layer 15 and the insulating layer 15. Put differently, a recess in the patterned carrier substrate 33 and/or the patterned insulating carrier substrate 33 serves to allow the cavity 35 to form below and/or near the electrical device 19 after bonding the patterned final carrier substrate 33 to the insulating layer 15.

The cavity 35 may be disposed in the patterned carrier substrate 33 such that it is spaced apart from a carrier substrate 33 surface facing the insulating layer 15 by less than 0.5 times the thickness of the patterned carrier substrate 33. In a further set-up the cavity and/or the recess in the patterned carrier substrate 33 is disposed below the device 19 and/or overlaps the electrical device 19 viewed in a direction of the thickness of the patterned carrier substrate 33. Thus, a region of the insulating layer 15 can be disposed between the cavity 35 and the electrical device 19.

By using the patterned carrier substrate 33 including the cavity 35 when producing the inventive apparatus, a jump in the acoustic impedance course can be achieved at the interface so that the reflection of the wave propagating in the patterned carrier substrate 33 is increased considerably. By this increase in the reflection of the acoustic wave achieved, the electromechanical performance of the device assembly 11 shown in FIG. 2d might be improved such that using one or several mirrors below the resonator in the electrical device 19 can be dispensed with.

Figure 2F:
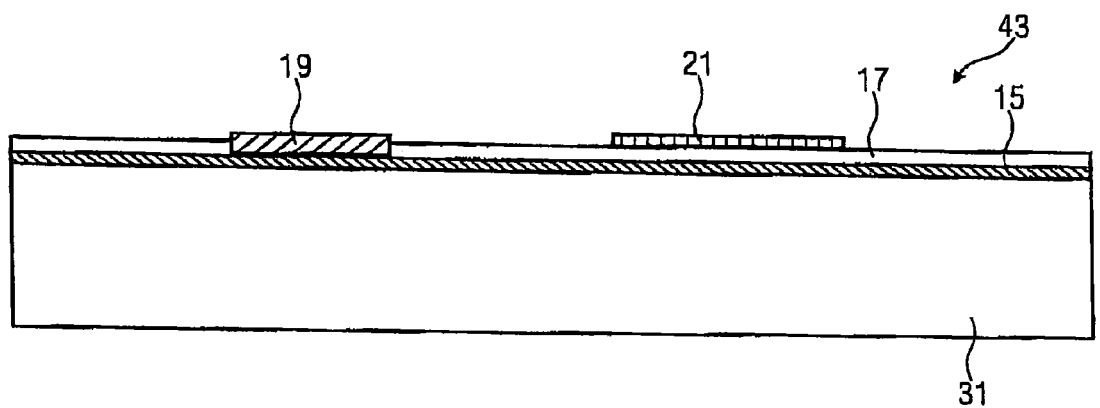

Subsequently, in step S21, the temporary carrier substrate 25 is detached or removed and the film 23 is detached or removed from the device layer structure 17 along with the carrier substrate 25 or in a subsequent further operating step. The set-up of an apparatus 43 including the device 19 produced in this way is shown in FIG. 2f. Instead of the final carrier substrate 31 shown in FIG. 2f, the patterned final carrier substrate 33 may also be disposed in the apparatus 43, in case the apparatus has been produced from the implementation of the device assembly 11 shown in FIG. 2d.

A capping for a BAW filter structure exemplarily implemented in the electrical device 19 may be formed on the device layer structure surface opposed to the insulating layer 15 by means of a WLP (Wafer Level Package) process.

An advantage of the apparatus 43 produced in this way is that by removing the starting semiconductor substrate, which is exemplarily made of silicon, a voltage-dependent capacitance between the conducting regions in the electrical device 19 or the electrical contact 21 on the one hand, that is the conducting regions above the substrate, and the starting semiconductor substrate 13 is prevented from occurring. Thus, circuits implemented on a silicon substrate, such as, for example, BAW filter structures, can be applied on any new substrate, like the patterned carrier substrate 33 or the insulating carrier substrate 31, and/or be connected thereto so that due to the improved electrical characteristics of the insulating carrier substrates 31, 33 the result will be improved electrical characteristics of the apparatus 43 produced.

Producing such an apparatus is easy in that a remaining film comprising a thickness of a few micrometers and consisting of the layers formed on the starting semiconductor substrate 13, that is the insulating layer 15 and the device layer structure 17, is easily applied on a new insulating carrier substrate. This is of particular advantage, since the device assembly 11 shown in FIG. 2a can be produced easily in a conventional semiconductor factory in which, for example, only silicon wafers can be processed, while the RF characteristics or the thermal characteristics of the apparatus 43 to be produced can be improved by removing the starting semiconductor substrate 13 and gluing onto the insulating substrate optimized as far as radio frequency characteristics or thermal characteristics are concerned.

The improvement achieved in this way can be obtained easily by producing a film including the device 19 and the layers 15, 17 after being applied on an intermediate carrier and/or the temporary carrier substrate 25. The film produced in this way is then glued to the insulating carrier substrate optimized in its characteristics. The substrate optimized in this way may, for example, also be a functional substrate comprising RF components. Thus, it is of advantage, as has already been mentioned, that the characteristics of the final carrier substrate can be chosen such that a voltage-dependent substrate capacitance is reduced and/or eliminated.

A thickness of the device layer structure 17 here exemplarily is in a range of less than 0.1 times a thickness of a final carrier substrate 31 and/or the patterned carrier substrate 33. A set-up of the apparatus 43 can also be produced such that a ratio of the thickness of the device layer structure 17 and a thickness of the final carrier substrate 31, 33 is in a range of less than 0.01. The thickness of the device layer structure 17 or the insulating layer 15 may then be chosen such that it is in a range of 0.1 .mu.m to 10 .mu.m, wherein exemplarily the set-up of the apparatus may also be chosen such that a ratio of the thickness of the insulating layer 15 and a thickness of the device layer structure 17 is in a range from 0.1 to 10.

A method for producing and/or manufacturing a starting product for producing an apparatus according to the present invention will be described below referring to FIGS. 3 and 4a-d. In step S31, a device structure 51 comprising a basic substrate 53 on the surface of which an insulation layer 55 is applied is provided. The insulation layer 55 here may be formed such that it can completely cover a surface of the basic substrate 53. On a surface of the insulation layer 55 opposed to the basic substrate 53, a device layer structure 57 comprising a recess is formed in which a circuit structure 59 and/or a device 59 is disposed. The device layer structure 57 here may be applied on the insulation layer 55 such that it completely covers a surface of the insulation layer 55, while the circuit structure 59 may be disposed in a recess of the device layer structure 57 such that the circuit structure 59 abuts on a surface of the insulation layer 55.

A contact structure 61 is formed on a device layer structure 57 surface opposed to the insulation layer 55. Furthermore, a resin layer 63 comprising a first recess 63a and a second recess 63b is disposed on the device layer structure 57 surface opposed to the insulation layer 55 and/or a contact structure 61 surface opposed to the device layer structure 57. The first recess 63a is a cavity formed above a surface of the circuit structure 59 and serving to influence and/or improve a performance of the circuit structure 59.

The first recess 63a is connected to a surface of resin layer 63 opposed to the device layer structure 57 via a plurality of holes, such as, exemplarily, four holes, wherein the holes, in a method step not discussed here served to allow removing a region of a sacrificial material in the resin layer 63 such that the first recess 63a has been formed. The second recess 63b extends from a resin layer 63 surface opposed to the device layer structure 57 to the contact structure 61. The purpose of the recess 63b will be discussed in greater detail later on. The set-up of the resin layer 63 shown in FIG. 4a may, for example, also be produced by means of applying a SU-8 photoresist and subsequently partly exposing and developing the photoresist.

After that, in step S33, a cover layer 65 is applied on the resin layer 63 in a patterned way so that the holes in the resin layer 63 extending from the first recess 63a away from the device layer structure 57 are sealed, while at the same time, the second recess 63b in the cover layer 65 and the resin layer 63 extends from a cover layer 65 surface opposed to the resin layer 63 to the contact structure 61. The multi-layered sequence formed of the cover layer 65 and the resin layer 63 is also referred to as a housing layer 66. The cover layer 65 may e.g. be formed of the same material as the resin layer 63, that is also of an SU-8 photoresist. Steps S31, S33 may also be performed in a single method step in which the continuous housing layer 66 comprising the recesses 63a, 63b would be formed in a step of applying the housing layer 66 in a patterned way.

Thus, after forming the circuit structure 59 on the basic substrate 53 and/or a semiconductor wafer and patterning the metal plane and/or the contact structure 61, covers can be implemented for filters implemented in the circuit structure 61, wherein one cover each is produced for every individual chip in the compound of the device structures 51, which are, for example, disposed on a wafer.

Figure 4A:
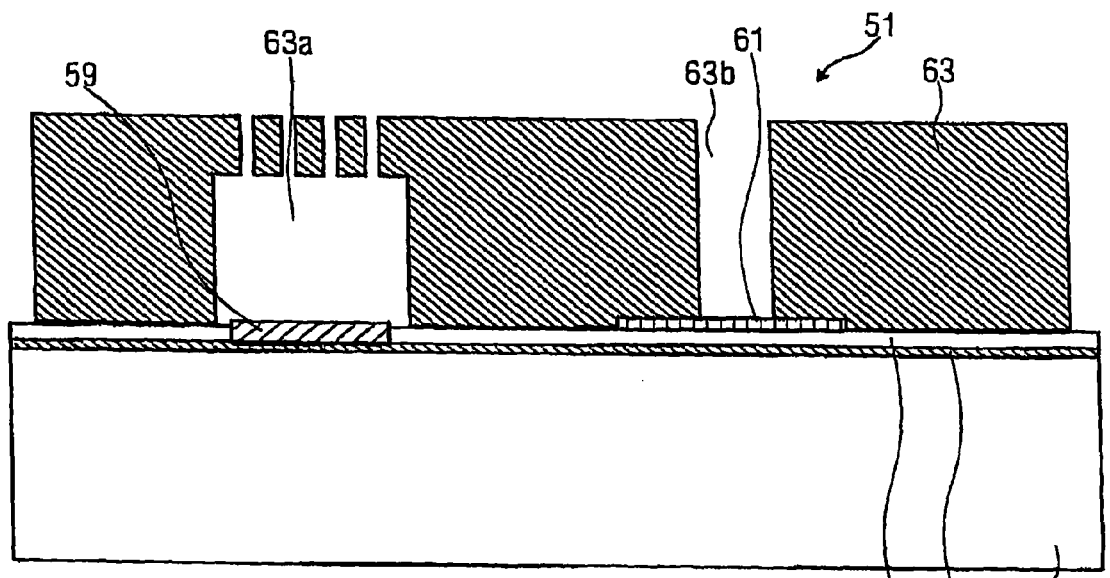
FIG. 4a-d are schematic views of the device structure during the production of the device structure.
Figure 4B:
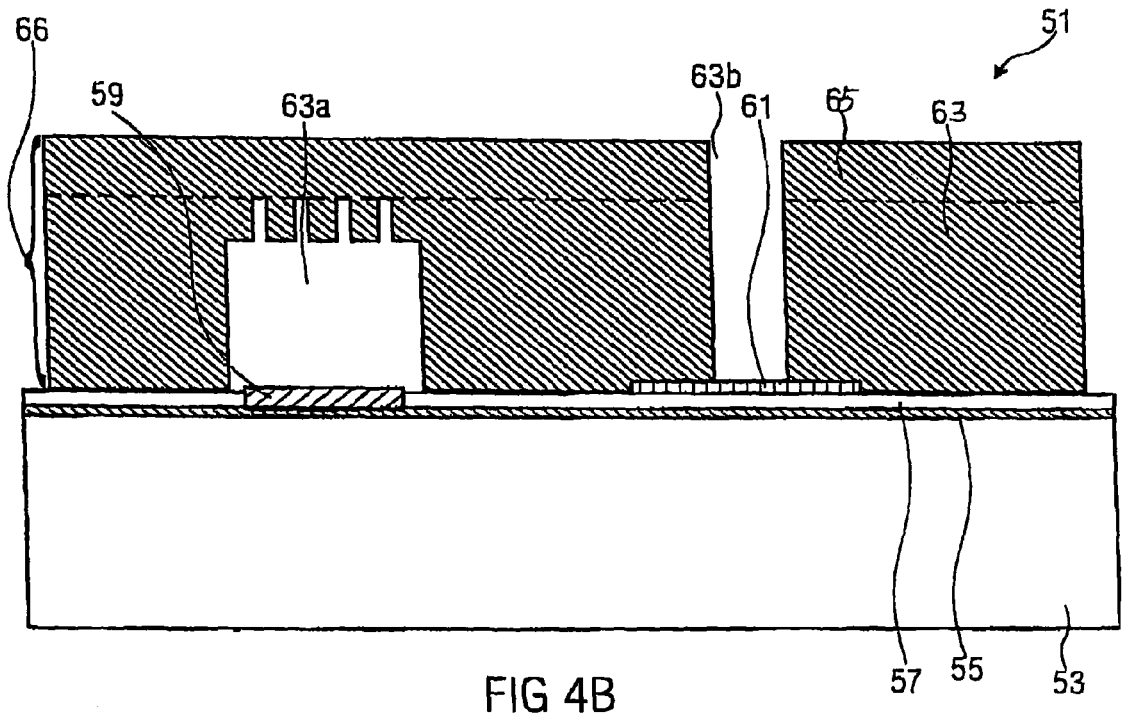
Figure 4C:
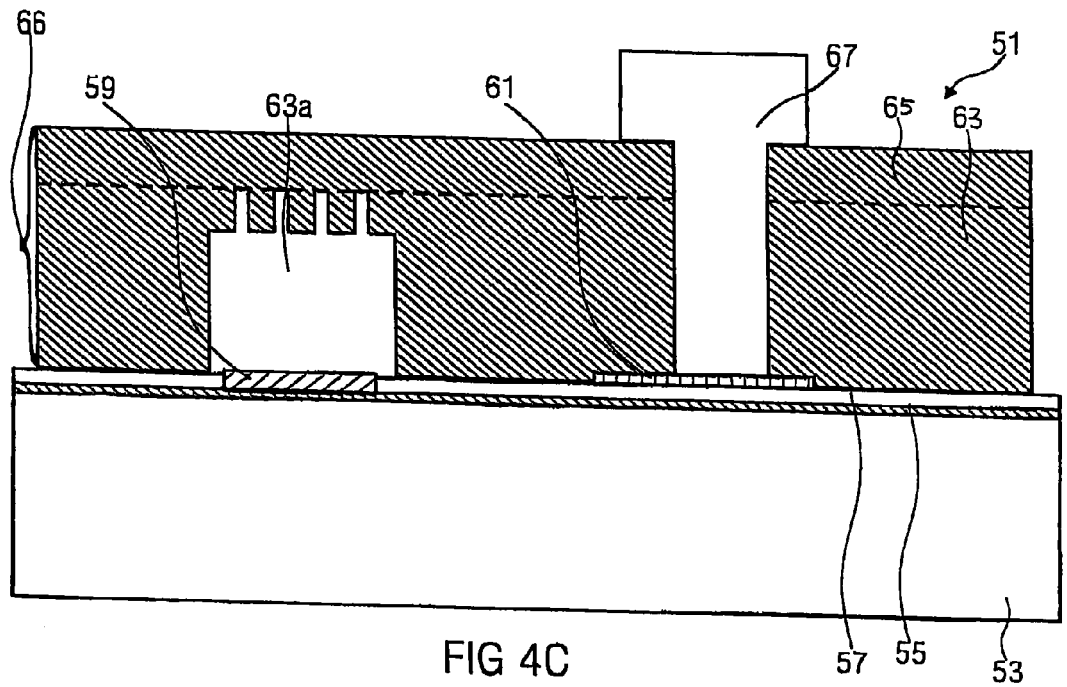

As an alternative to the processes discussed in FIGS. 4a-4b, instead of applying the resin layer 63 and the cover layer 65 in a patterned way by means of a bond method, such as, for example, thermal-compression bonding, a structure made of a solid material, such as, for example, glass, comprising a set up comprising the recesses 63a, 63b patterned like in FIG. 4b may be applied.

After that, in step S35, a pad contact 67 and/or a conductive connection between the contact structure 61 and a housing layer 65 surface opposed to the device layer structure 57 is produced by means of a screen printing method. The result is the set up of device structure 51 shown in FIG. 4c. Finally, in step S37, a solder bump 69 is produced on a conductive connection 67 surface opposed to the contact structure 61. The solder bump 69 can serve to produce an electrical or mechanical contact of the device structure 51 to an external contact, wherein the device structure 51 is implemented in an apparatus in a production method discussed below.

Figure 4D:
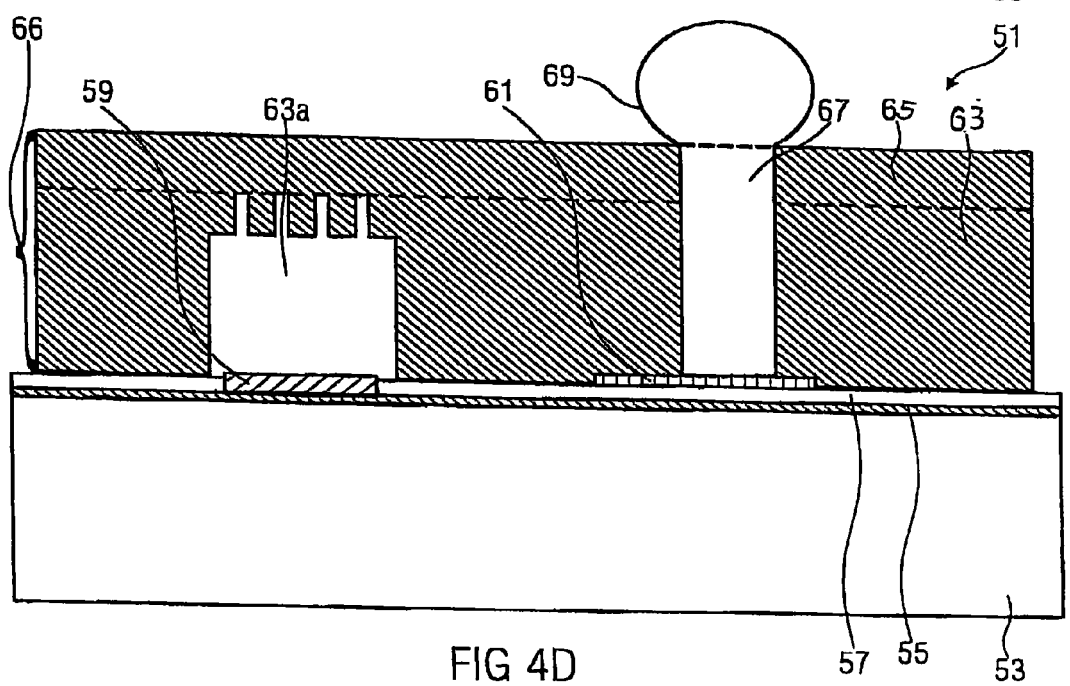

Subsequently, a method for producing an apparatus comprising a device according to an embodiment of the present invention will be discussed in FIG. 5. For this purpose, the device structures 51 disposed in a compound, for example a wafer compound, are provided in step S51. A detailed view of one of these device structures 51 being part of this compound is shown in FIG. 4d. After that, in step S53 a film, for example a thermal-release film, is disposed and/or laminated on the housing layer 66 and the solder bump 69. The film 71 covers the housing layer 66 or the cover and the solder bump or the contact bump and protects them from damage during further method steps.

Figure 6:
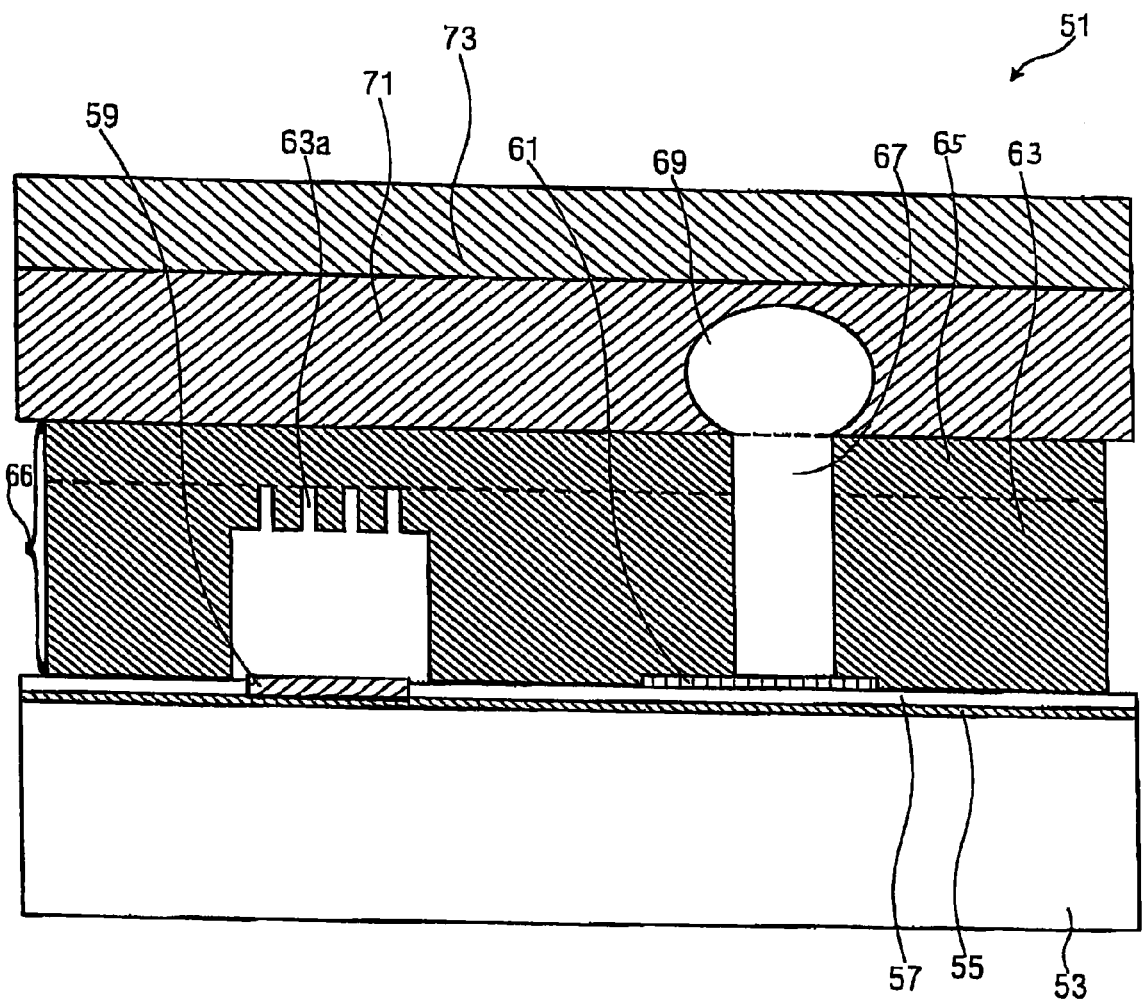
FIG. 6 is a detailed view of an intermediate product manufactured during a method for producing the apparatus comprising the device.

Subsequently, in step S55, a substitute carrier substrate 73, for example, a carrier wafer, is disposed and/or applied on a film 71 surface opposed to the housing layer 66. A detailed view of a device structure 51 produced in this way which is disposed in a compound comprising a plurality of device structures 51 is shown in FIG. 6. The detailed view shown discusses the set up of the device structure 51 comprising the film 71 disposed on a housing layer 66 surface opposed to the device layer structure 57 and the substitute carrier substrate 73 or the temporary carrier substrate 73 disposed on a film 71 surface opposed to the housing layer 66.

Subsequently, in step S57 the basis substrate 53 is thinned starting from the back side and/or the basic substrate 53 side opposed to the insulation layer 55. Thinning of the semiconductor substrate or basic substrate 53 here may be performed by means of grinding or etching, wherein the etch process can even be performed such that the insulation layer 55 serves as an etch stop layer for an etch process spreading from the back side of the basic substrate 53. The etch stop layer here can, for example, be produced easily by the insulation layer 55 and/or the etch stop layer being formed of an oxide and/or silicon nitride when the basic substrate 53 is made of a silicon so that the entire silicon substrate up to the oxide layer is removed when thinning S57 the basic substrate 53.

Figure 7A:
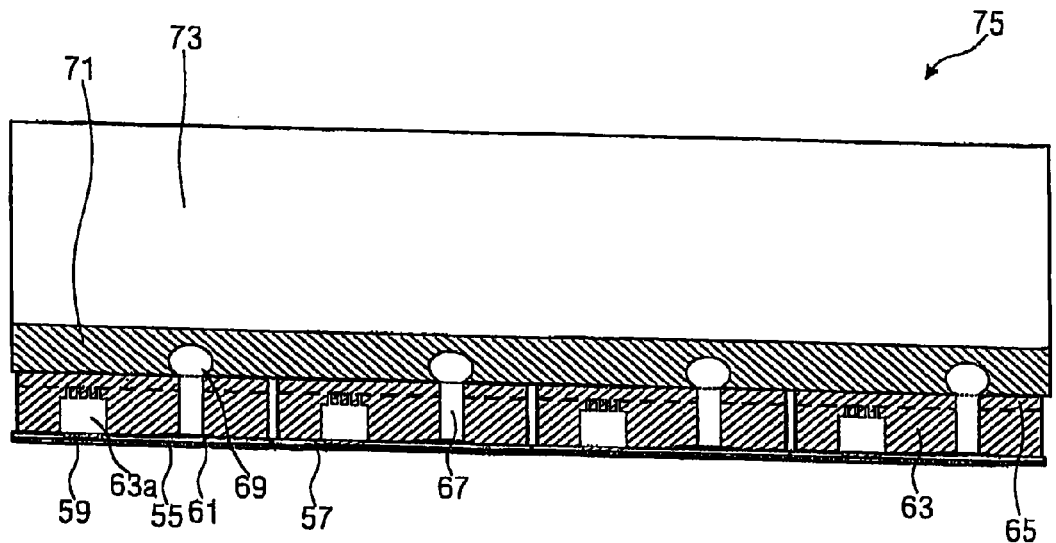
FIGS. 7a-b are schematic views of another intermediate product having been produced in the production method.
Figure 7B:
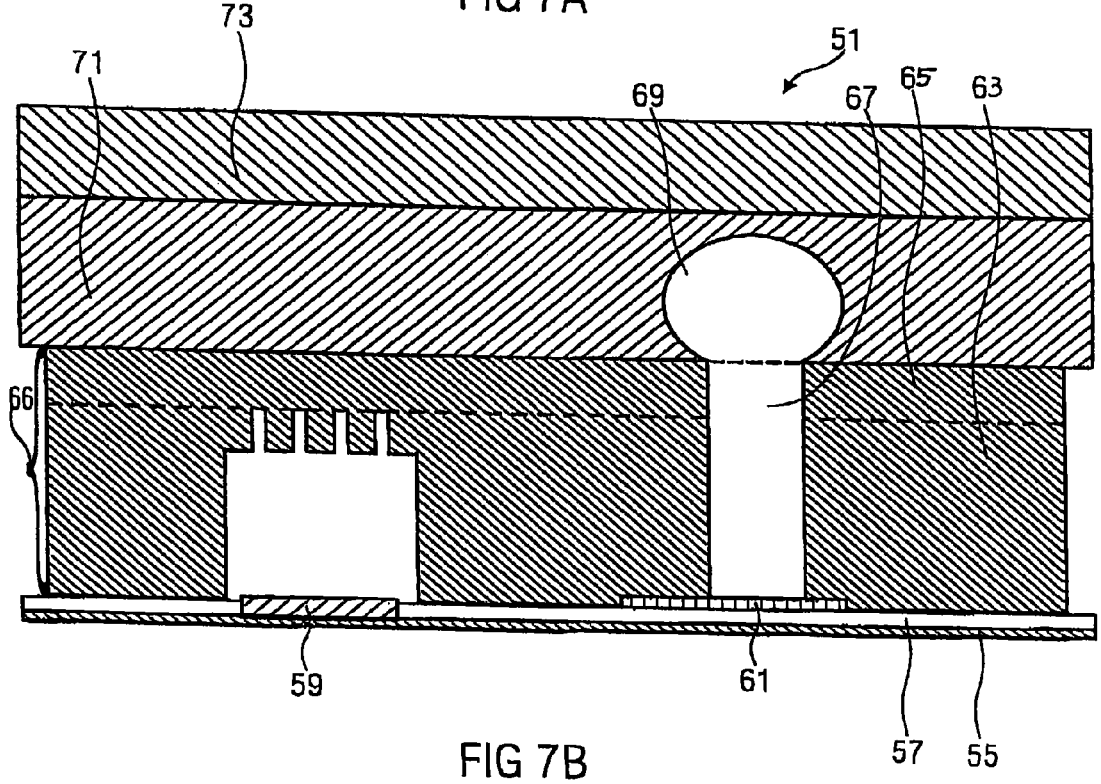

FIG. 7a is a schematic view of the device structures 51 disposed in a compound 75 after thinning S57 the basic substrate 53. FIG. 7b represents a detailed view of the single device structure 51 comprising the film 71 and a portion of the carrier wafer 73. Subsequently, in step S59 the temporary carrier substrate 73 is removed along with the film 71 and the device structures 51 disposed in the compound 75 are sawed and thus diced in step S61.

Figure 8A:
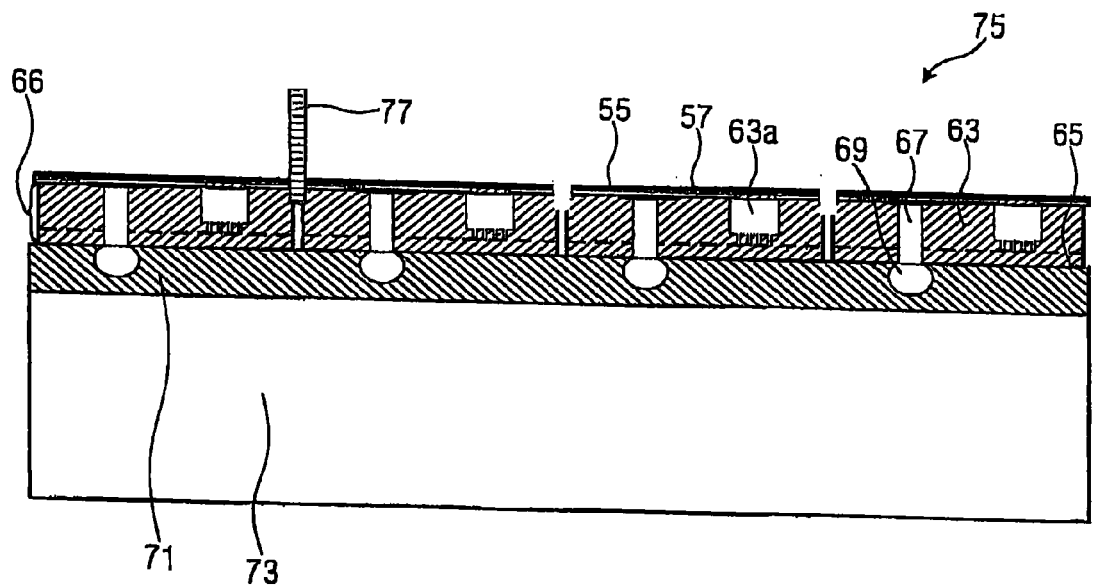
FIG. 8a-c are schematic views of the apparatus comprising the device during production.

However, as is illustrated in FIG. 8a, sawing S61 may also take place before removing the temporary carrier substrate 73. FIG. 8a explains how a saw blade 77 of a saw produces a recess between the two device structures 51 and separates these from each other.

Figure 8B:
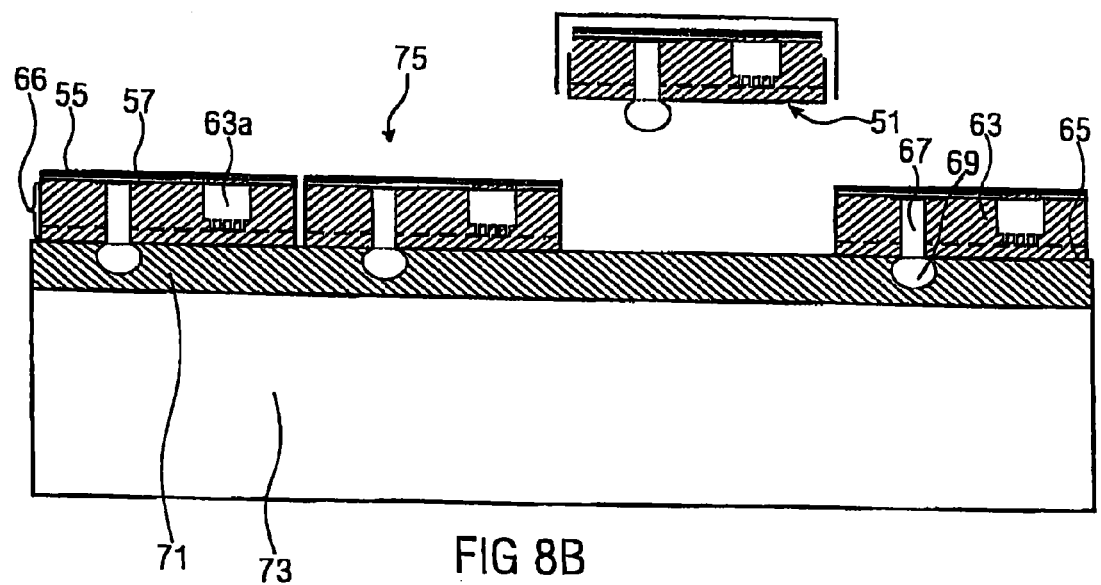
Figure 8C:
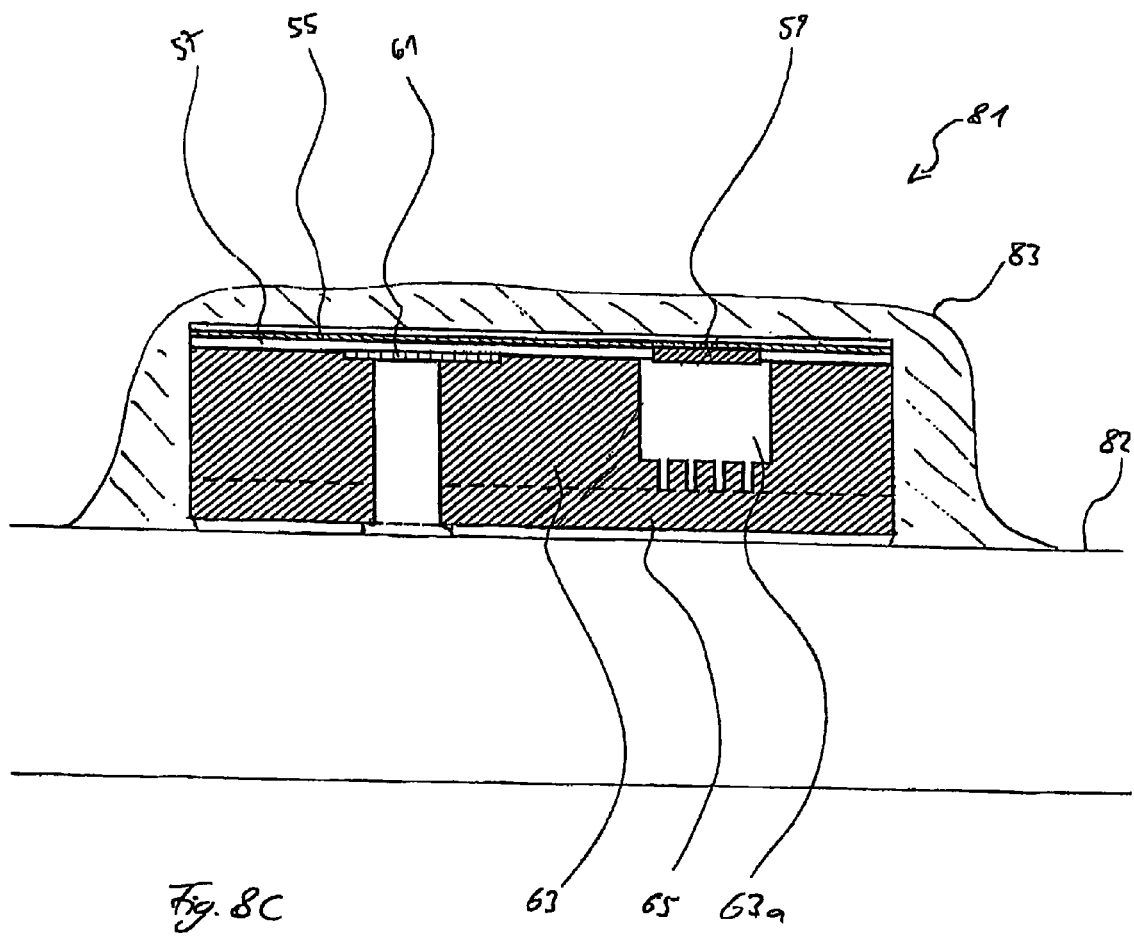

Finally, in step S63 the device structures 51 are detached from the film 71 in a pick-and-place process by a handler, assembled and finally measured. FIG. 8b shows how the single device structure 51 is detached from the compound 75 and displaced by a handler for further processing. FIG. 8c shows an apparatus 81 comprising the circuit structure 59 or device 59 in a state mounted to a circuit board 82. As may be seen, assembling S63 may be performed such that a molding material 83 surrounds the device structure 51 or completely covers the device structure 51. The molding material layer 83 has been applied during assembling S63 such that it abuts on the insulation layer 55 surface opposed to the device layer structure 57 and encapsulates the apparatus 81. However, the molding material is optional.

The apparatus 81 shown in FIG. 8c and the method for producing the apparatus 81 are of advantage in that the circuit structure 59 can be produced on a conventional basic substrate, such as e.g. a silicon substrate, in mass production, however at the same time the voltage-dependent substrate capacitance occurring between the metal layers of the circuit structure 59 and the basic substrate 53 can be reduced and/or eliminated as a consequence of thinning S57 the semi-conductor substrate 53. Thus, the apparatus of the circuit structure 59 shown in FIG. 8c has a lower voltage-dependent substrate capacitance and/or no voltage-dependent substrate capacitance so that the electrical characteristics are improved compared to a conventional apparatus in which the basic substrate is not thinned and/or removed.

Figure 5:
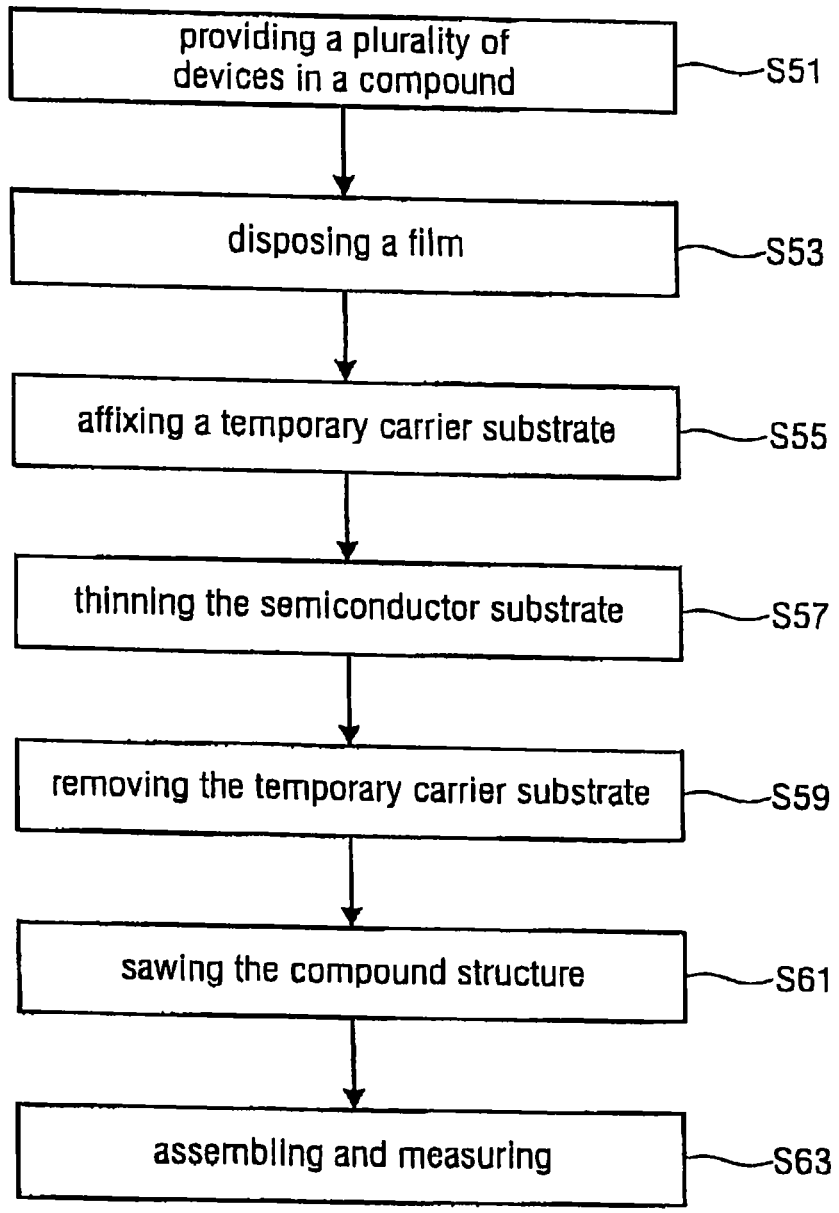
FIG. 5 shows a method for producing an apparatus comprising a device according to an embodiment of the present invention.

In particular, it is of advantage that the methods steps shown in FIG. 5 can all be performed in a production designed for processing devices having silicon substrate. Thus, the apparatuses 81 comprising the circuit structure 59 can be produced in an easy and cheap manner, which at the same time comprise an improved electrical performance compared to conventional apparatuses applied on silicon substrates. Apart from reducing the voltage-dependent substrate capacitance as a consequence of avoiding the MOS effect, another advantage is that the structural height of the apparatus 81 shown in FIG. 8c is smaller compared to conventional chips or apparatuses since the basic substrate 51 has been removed and/or thinned. At the same time, the probability of back side modes or mechanical oscillations occurring in a substrate below the circuit structure 59, which is particularly disturbing in a BAW filter, is reduced.

Apart from the method for producing the apparatus 81 discussed above, FIG. 9 and FIG. 10a-d discuss an alternative method for producing the apparatus 81 according to another embodiment of the present invention. Subsequently, same elements or elements having the same effect are provided with the same reference numerals. Furthermore, the following explanation predominantly emphasizes the differences in the method for producing the apparatus 81 according to the present invention and particularly discusses the differences to the method flow illustrated in FIGS. 5, 6, 7a-7b, 8a-8c.

Figure 9:
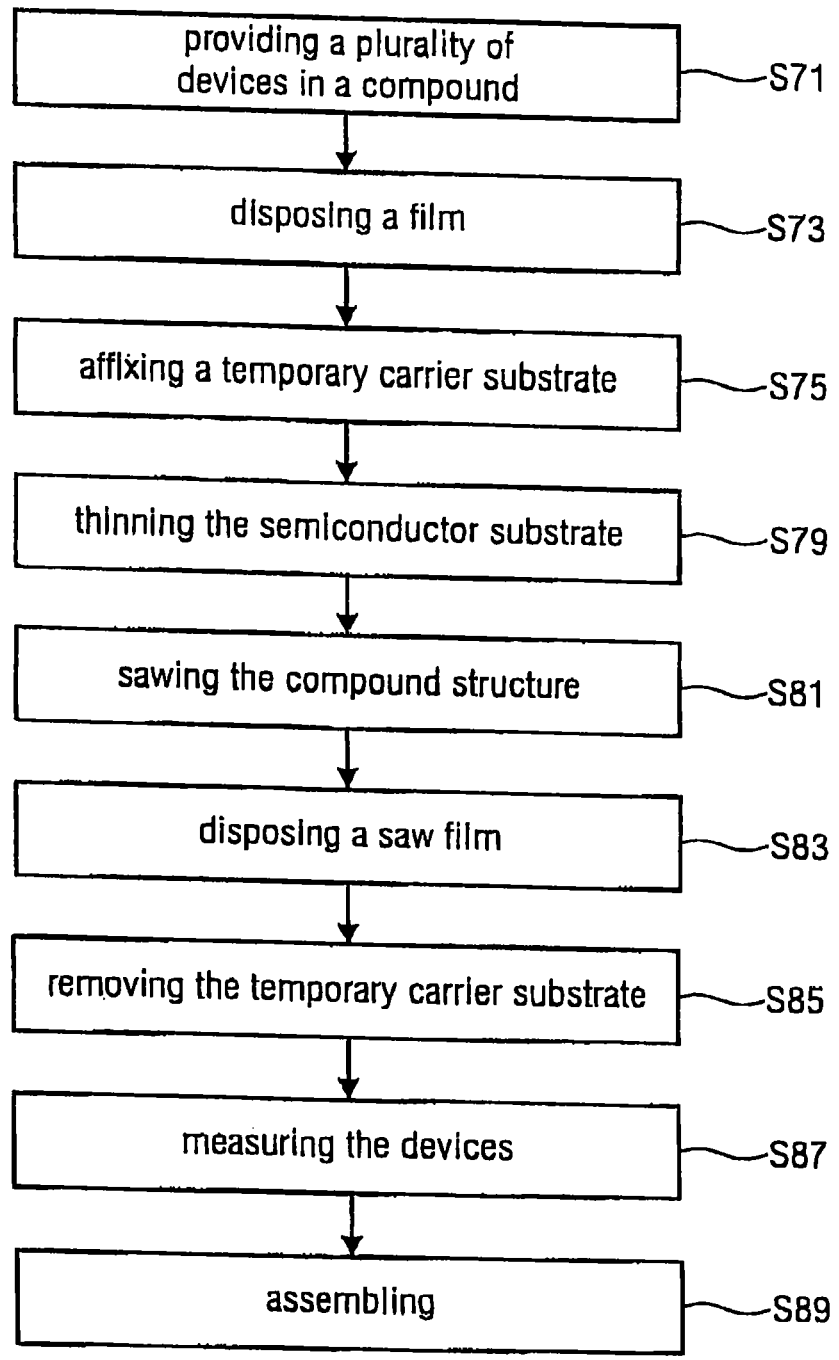
FIG. 9 shows a method for producing the apparatus comprising the device according to another embodiment of the present invention.

As is illustrated in FIG. 9, in the method for producing the apparatus according to an embodiment of the present invention, at first a plurality of device structures 51 are provided in the compound 75 in step S71. Subsequently, in step S73, similar to step S53, a film is applied and/or disposed on the compound 75. After that, in step S75 the temporary carrier substrate 73 is affixed to the film 71 on a film 71 surface opposed to the housing layer 66.

Figure 10A:
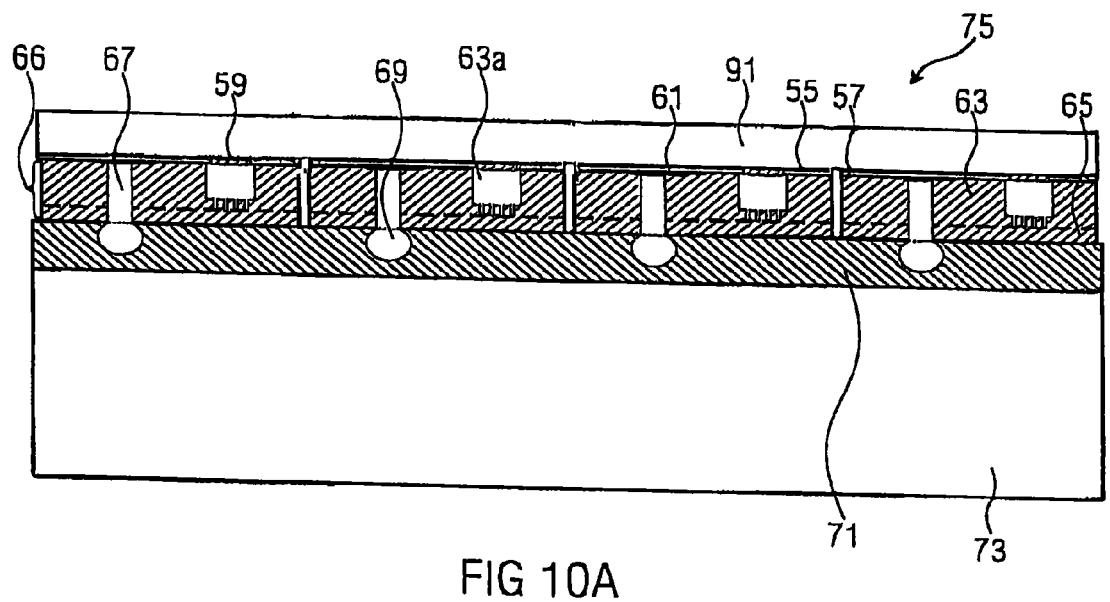
FIGS. 10a-d are schematic views of a plurality of apparatuses disposed in a compound in a production method according to another embodiment of the present invention.

After that, in step S79, like in step S57 in FIG. 5, the basic substrate 53 is thinned and/or removed. Subsequently, in step S81, the compound 75 or compound structure 75 is sawn so that the recesses between the device structures 51 are formed. Subsequently, in step S83, a saw film 91 is laminated or disposed on the insulation layer 55 of the device structures 51 in the compound 75 and the set up of the compound 75 shown in FIG. 10a is produced. As can be seen from FIG. 10a the saw film is disposed on the insulation layer 55 surface opposed to the device layer structure 57.

Subsequently, in step S85, the temporary carrier wafer 73 is removed or detached along with the film 71. Detaching S85 the temporary carrier wafer 73 and detaching the film 71, however, may also be performed sequentially one after the other in two separately performed method steps. A set up of the compound 75 resulting is shown in FIG. 10b.

Figure 10B:
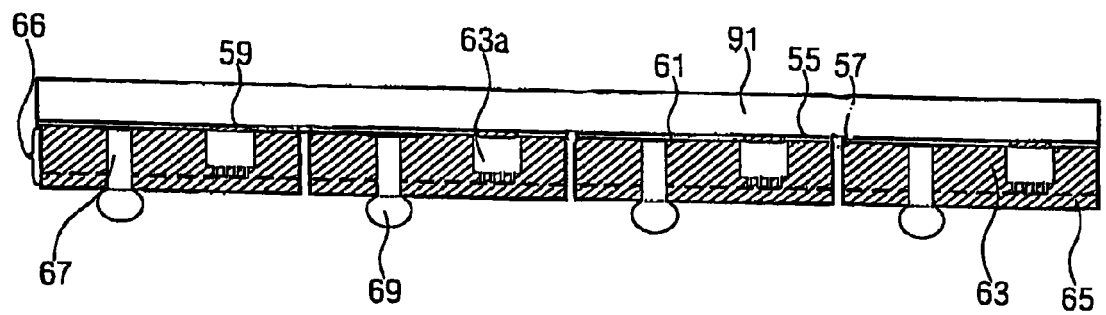
Figure 10C:
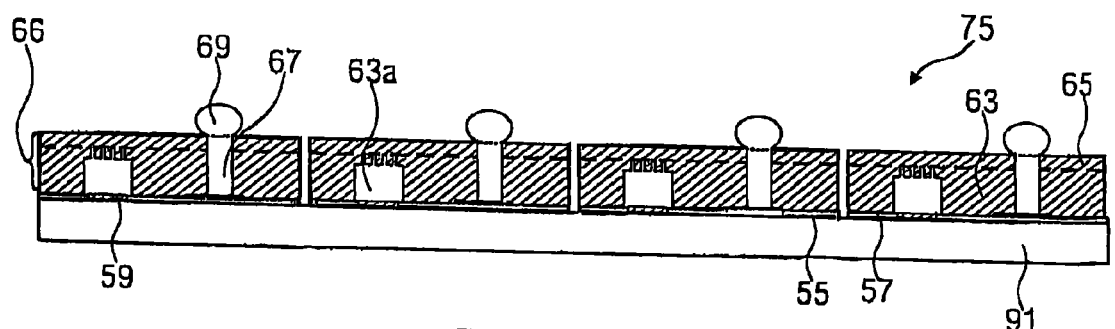
Figure 10D:
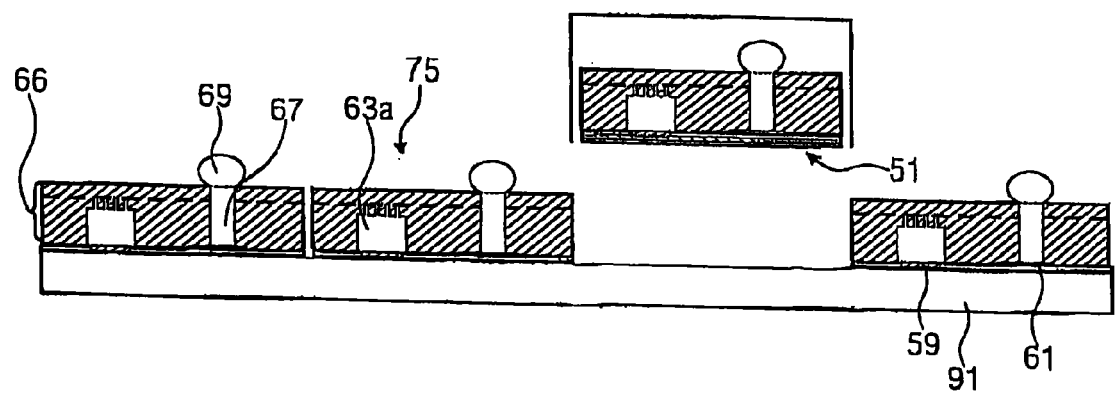

After that, the compound 75 shown in FIG. 10b of the device structures 51 on the saw film 91 is positioned, as is shown in FIG. 10c, such that the solder bumps 69 are arranged on the top and can be contacted by probes of a measuring device not shown here. After measuring S87 the device structures 51, they are removed or detached from the saw film 91 by means of a handler, as is shown in FIG. 10d, and assembled in a subsequent method step S89. The apparatus produced corresponds to the apparatus 81 illustrated in FIG. 8c.

Figure 11:
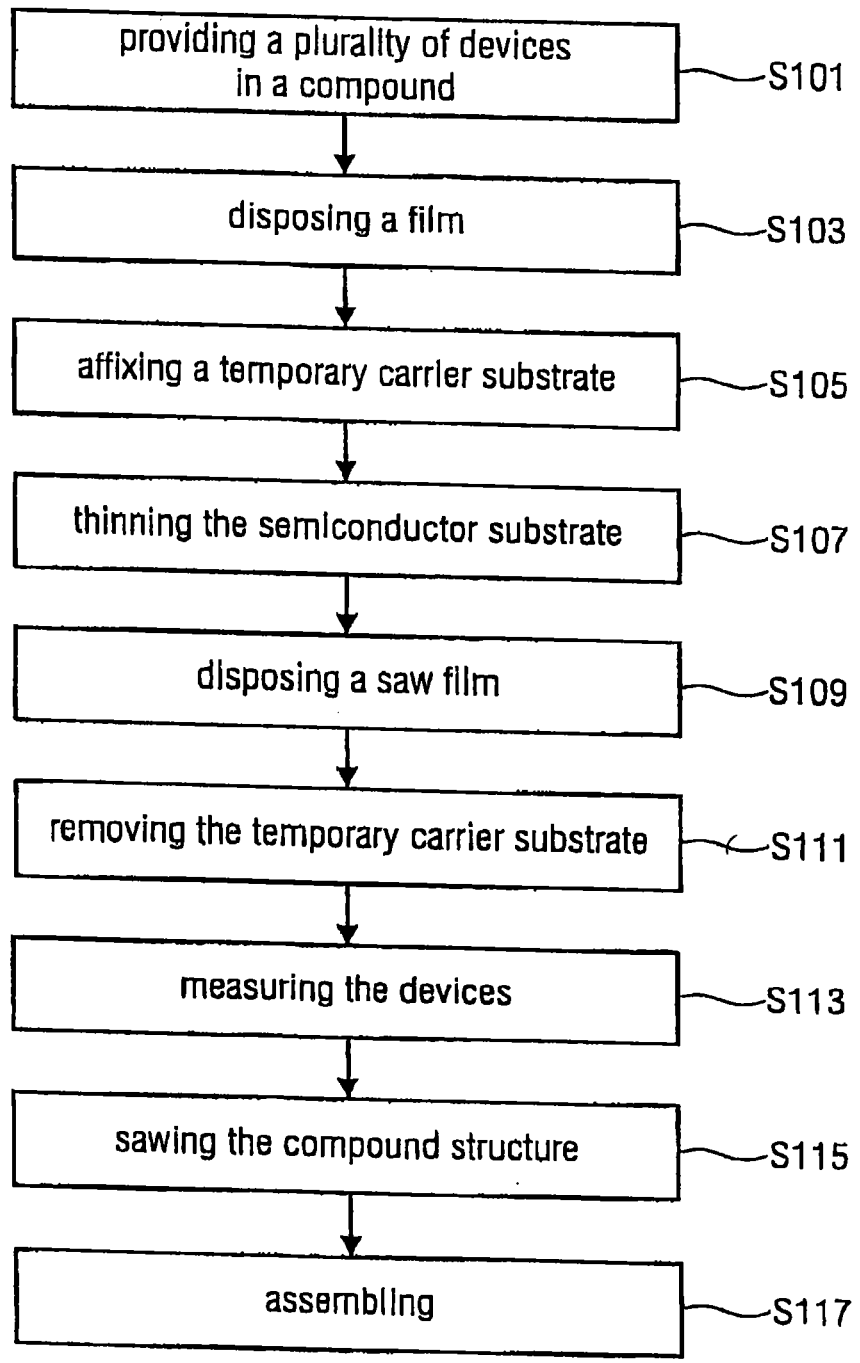
FIG. 11 shows a method for producing an apparatus comprising a device according to an embodiment of the present invention.

A third possible variation apart from the methods for producing the apparatus 81 discussed in FIGS. 5 and 9 is shown in FIG. 11. Subsequently, same elements or elements having the same effect like those in the production method discussed in FIGS. 10a-10d for the apparatus 81 shown in FIG. 8c are provided with the same reference numerals. Furthermore, the following description predominantly emphasizes the differences in the method flow in the method for producing the apparatus 81 according to an embodiment of the present invention.

Like in steps S71, S73, S75, S79 of the production methods explained in FIG. 9, in the method for producing the apparatus 81 shown in FIG. 11, the plurality of device structures 51 are provided in the compound 75 at first in step S101 and the film 71 is laminated or disposed on the compound 75 in step S103, after that the temporary carrier substrate 73 is affixed to the film 71 in step S105 and subsequently the basic substrate 53 is thinned and/or removed.

Figure 12A:
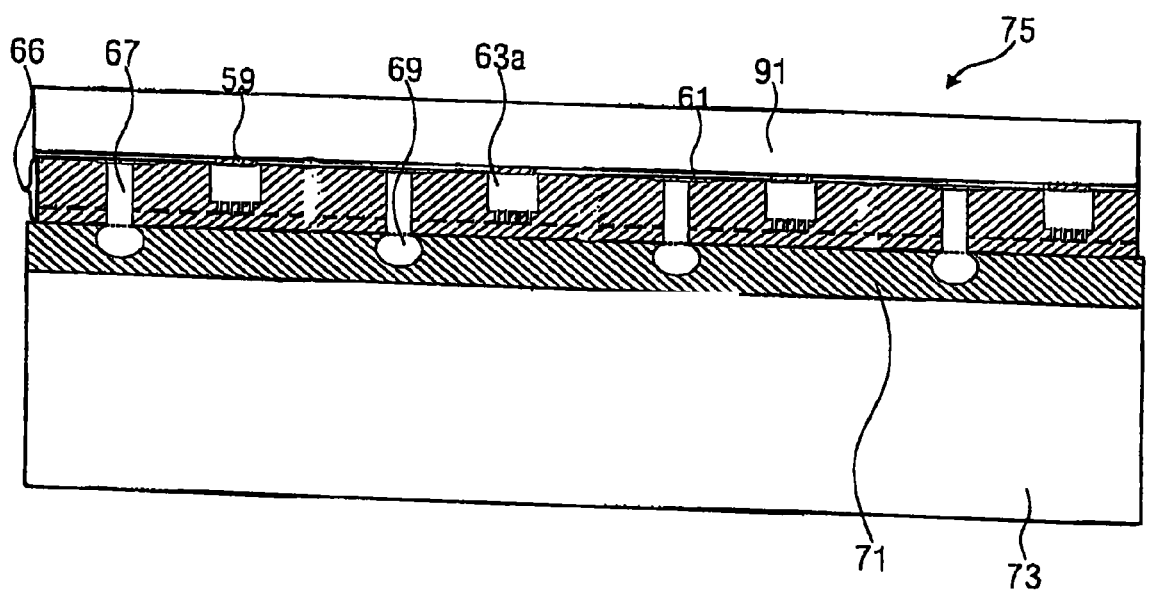
FIGS. 12a-e are schematic views of the apparatus comprising the device in a production method according to an embodiment of the present invention.
Figure 12B:
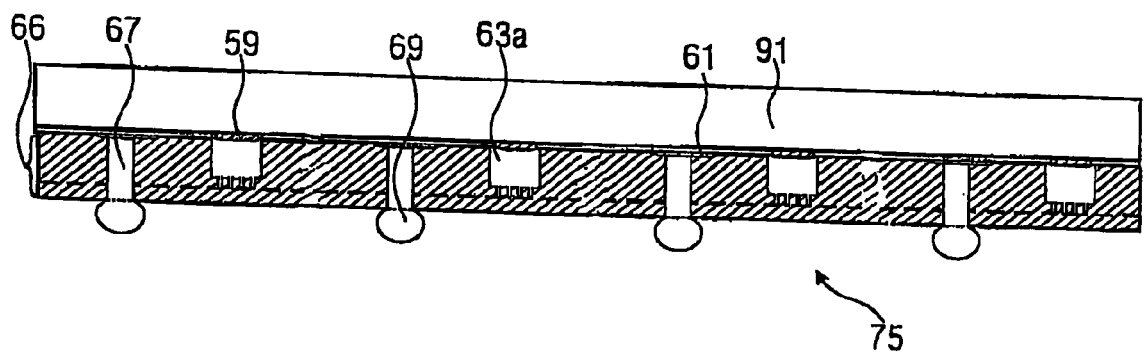

In contrast to the method flow shown in FIG. 9, however, subsequently, the saw film 91 is laminated and/or disposed on an insulation layer 55 surface opposed to the semi-conductor material layer 57 in step S109. The set up of the compound 75 produced is shown in FIG. 12a. Subsequently, in step S111 the temporary carrier wafer 73 is removed along with the film 71 and/or the thermal-release film. FIG. 12b shows the resulting set up of the compound 75.

Figure 12C:
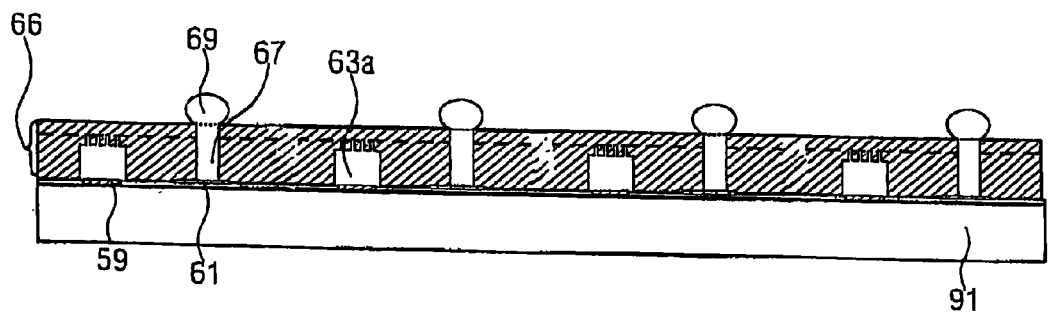
Figure 12D:
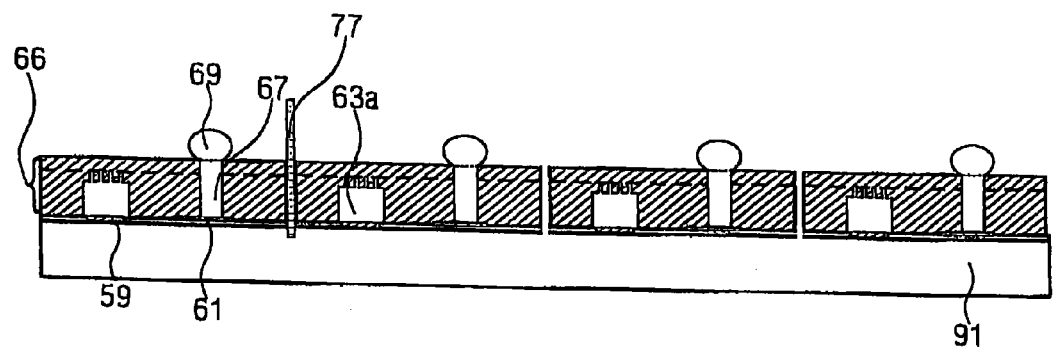

After that, the device structures 51 in the compound 75 are turned and displaced by means of a handler so that they are disposed in a way shown in FIG. 12c. In the device structures 51 shown in FIG. 12c, solder bumps 69 have a top orientation so that they can be contacted and measured, as has already been discussed above, in step S113 by probes of a measuring device. After measuring S113, the device structures 51 disposed in the compound 75 are sawn in step S115, FIG. 12d showing how the saw blade 77 penetrates a gap between the two device structures 51 and separates the two device structures 51 from each other.

Figure 12E:
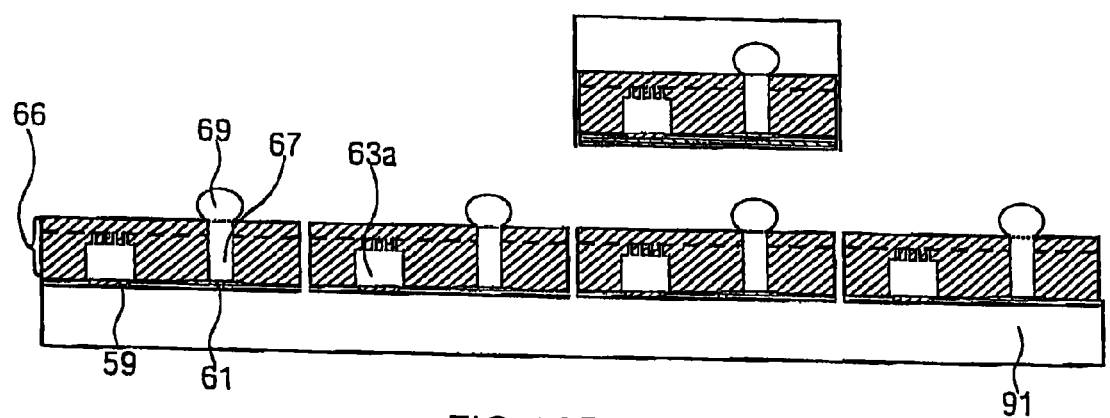

After sawing S115, the chips and/or device structures 51 are each removed or taken away from the saw film 91. FIG. 12e shows how the device structure 51 is detached from the compound 75 exemplarily in a handler in a pick-and-place process. Finally, in step S117 the device structure 51 is assembled the result being the apparatus 81. The set up of the apparatus 81 has already been discussed in FIG. 8c and the respective description.

In the methods for producing the apparatus comprising a device discussed in FIGS. 1, 5, 9 and 11, a film, such as, for example, a thermal-release film, is applied at first on an intermediate product and subsequently a temporary carrier substrate or a carrier wafer is disposed on the set up produced in this way. However, it would also be conceivable to apply the film on the temporary carrier substrate or the temporary carrier wafer and to subsequently place the structure produced onto the intermediate product, the compound 75 or the device assembly 11 on a film surface opposed to the carrier substrate or the carrier wafer. In step S19, the final carrier substrate is affixed to a surface of the insulating layer 15 by means of a gluing method or bonding method. Any gluing method or bonding method, such as, for example, anodic bonding, can be employed here.

The insulating layer 15 or the insulation layer 55 is exemplarily made of silicon nitride or silicon oxide, however, any insulating material can be used alternatively. The device layer structure 17, 57 comprises one or several layers made of any material, such as, for example, an insulating material.

Figure 3:
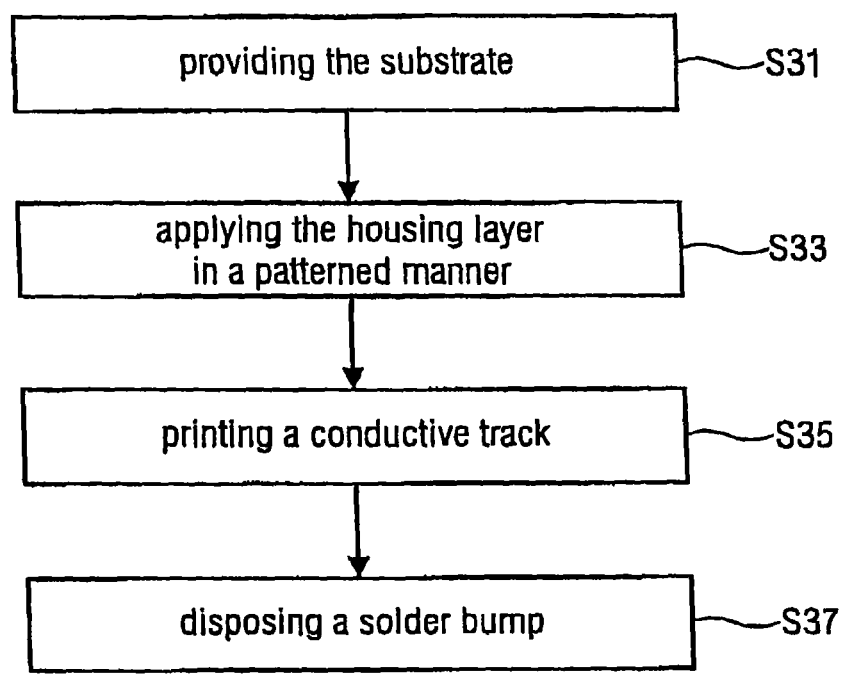
FIG. 3 shows a method for producing a device structure serving as a starting material for producing an apparatus comprising a device according to an embodiment of the present invention.

In the method for producing the device structure 51 shown in FIG. 3, the cover layer 65 is applied on the resin layer 63. However, instead of applying the cover layer 65 on the resin layer 63, it would also be conceivable to apply the cover layer 66 as a continuous layer directly on the device layer structure 57. This may even take place in a single method step in which exemplarily the recesses 63a, 63b may also be formed. Also, in the method shown in FIG. 3, the conductive track 67 may be applied by means of any method step, such as, for example, printing the conductive track or applying the conductive track by means of screen printing.

In the method flows illustrated in FIGS. 1, 5, 9 and 11, the temporary carrier substrate 25 and/or the temporary carrier wafer 73 are formed of any material, such as, for example, an insulating material or a semiconductor material. In the method for producing the apparatus 43 discussed in FIG. 1, the final carrier substrate 31, 33, may also be formed of any insulating material. Potential insulating materials are glass or ceramic. The molding material layer 83 in the apparatus 81 may be formed of any material, for example, plastics.

In the apparatus 81, a thickness of the device layer structure 57 is, for example, in a range from 0.1.mu.m to 10.mu.m, however, any thicknesses of the device layer structure 57 may be used alternatively. Furthermore, in the apparatus 81 a total thickness of the housing layer is more than ten times a thickness of the device layer structure, however any ratio values of the thickness of the housing layer to the thickness of the device layer structure can be used alternatively.

In addition, in the apparatus 81, according to an embodiment of the present invention, a thickness of the insulating layer exemplarily is in a range from 0.1 .mu.m to 10 .mu.m. However, any values of the thickness of the insulating layer 55 may be used alternatively. In the device structure 51 shown in FIG. 4b, the patterned housing layer 67 may also be replaced by a patterned solid body exemplarily formed of a material comprising a modulus of elasticity higher than 100 MPa, or a modulus of elasticity higher than 1 GPa. In particular, SU8 with a modulus of elasticity higher than 4 GPa could be used for the patterned housing layer 67.

In the apparatus 81 and the apparatus 43, at least one conductive track is disposed each in the electrical device 19 on the one hand and the circuit structure 59 on the other hand, so that two conductive tracks separate from each other are disposed on an insulating layer 15 or insulation layer 55 side facing the device layer structure 17 or the device layer structure 57. However, any numbers of conductive tracks spaced apart from one another can be used alternatively in the assemblies discussed.

In the method for producing shown in FIG. 5, FIG. 9 and/or FIG. 11 the step of removing the substitute carrier substrate S59, S85, S111 can be omitted. Apart from this the steps S37, S53, S61, S73 S81, S83, S87, S103 S109 S113 and/or S115 can be omitted in the methods for producing shown in FIG. 3, FIG. 5, FIG. 9 and FIG. 11.

The invention claimed is:

1. An apparatus, comprising:
a device integrated into a device layer structure disposed on an insulating layer, wherein a thickness of the insulating layer is in a range of about 0.1 micrometers (μm) to about 10 μm, and a thickness of the device layer structure is in a range from about 0.1 μm to about 10 μm, wherein the device comprises a bulk acoustic wave filter;
a housing layer arranged so that the insulating layer continuously extends between the housing layer and the insulating layer and the device layer structure is arranged between the housing layer and the insulating layer, the housing layer housing the device by the housing layer forming a cavity disposed between a housing layer surface of the housing layer facing the device layer structure and a device layer structure surface of the device layer structure facing the housing layer with the device bordering the cavity, wherein a total thickness of the housing layer is more than ten times a thickness of the device layer structure, and wherein the housing layer comprises a solid material, a modulus of elasticity of the solid material being greater than about 100 MPa;
a contact providing an electrical connection between the device and a surface of the housing layer opposite to the device layer structure; and
a molding material surrounding the housing layer and the insulating layer, the molding material directly abutting on a surface of the insulating layer being opposite to the device layer structure.

2. The apparatus according to claim 1, wherein the housing layer comprises a resin.

3. The apparatus according to claim 1, wherein the housing layer comprises a photoresist.

4. The apparatus according to claim 1, wherein the insulating layer comprises a silicon nitride or a silicon oxide.

5. The apparatus according to claim 1, wherein a solder bump is disposed on the housing layer, the solder bump penetrating the molding material and electrically connecting to the device.

6. The apparatus according to claim 1, wherein a solder bump is disposed on, and penetrates the molding material at a side of the housing layer facing away from the insulating layer, and electrically connects to the device.

7. The apparatus according to claim 6, wherein a cavity is disposed between a side of the housing layer facing the device layer structure and a side of the device layer structure facing the housing layer, with the device bordering to the cavity.

8. The apparatus according to claim 7, wherein the device comprises a bulk acoustic wave filter.

9. The apparatus according to claim 1, further comprising a circuit board, on a main surface of which the device is mounted with the contact contacting the circuit board's main surface and the surface of the insulating layer opposite to the device layer structure facing away from the circuit board, wherein the molding material abuts the main surface of the circuit board so as to encapsulate, along with the circuit board, the device layer structure, the insulating layer, the housing layer and the contact.

10. An apparatus, comprising:
a device integrated into a device layer structure disposed on an insulating layer, wherein a thickness of the insulating layer is in a range of about 0.1 micrometers (μm) to about 10 μm, and a thickness of the device layer structure is in a range of about 0.1 μm to about 10 μm, wherein the device comprises a bulk acoustic wave filter;
a housing layer arranged so that the insulating layer continuously extends between the housing layer and the insulating layer and the device layer structure is arranged between the housing layer and insulating layer, the housing layer housing the device by the housing layer forming a cavity which is disposed between a housing layer surface facing the device layer structure and a device layer structure surface facing the housing layer with the device bordering the cavity, wherein a total thickness of the housing layer is more than ten times a thickness of the device layer structure, and wherein the housing layer comprises a solid material, a modulus of elasticity of the solid material being greater than about 100 MPa;

a contact providing an electrical connection between the device and a surface of the housing layer opposite to the device layer structure; and a surface of the insulating layer being opposite to the device layer structure being exposed.

* * * * *